(12) United States Patent
Noh et al.

(10) Patent No.: US 7,504,199 B2
(45) Date of Patent: Mar. 17, 2009

(54) METHOD OF FORMING METAL PATTERN HAVING LOW RESISTIVITY

(75) Inventors: Chang Ho Noh, Gyeonggi-Do (KR); Ki Yong Song, Seoul (KR); Jin Young Kim, Gyeonggi-Do (KR); Tamara Byk, Gyeonggi-Do (KR); Gennady A. Branitsky, Minsk (BY); Tatyana V. Gaevskaya, Minsk (BY); Valeri G. Sokolov, Minsk (BY)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 340 days.

(21) Appl. No.: 10/959,435

(22) Filed: Oct. 7, 2004

(65) Prior Publication Data

US 2005/0202599 A1    Sep. 15, 2005

(30) Foreign Application Priority Data

Dec. 16, 2003   (KR) ...................... 10-2003-0092112

(51) Int. Cl.
   *G03F 7/26*     (2006.01)
(52) U.S. Cl. ......................... 430/315; 430/313; 430/330
(58) Field of Classification Search ................ 430/315, 430/324, 313, 311, 330, 322
   See application file for complete search history.

(56) References Cited

U.S. PATENT DOCUMENTS 5,235,139 A * 8/1993 Bengston et al. ............ 174/257

| 5,534,312 | A  |   | 7/1996 | Hill et al. |
| 5,908,497 | A  | * | 6/1999 | Morfesis et al. ......... 106/287.18 |
| 6,294,313 | B1 | * | 9/2001 | Kobayashi et al. ........... 430/302 |
| 6,344,309 | B2 | * | 2/2002 | Fukushima et al. ......... 430/324 |
| 6,521,285 | B1 |   | 2/2003 | Biebuyck et al. |

(Continued)

FOREIGN PATENT DOCUMENTS

| JP | 09-260808   | 3/1997  |
| JP | 11-344804   | 12/1999 |
| JP | 2000-255165 | 9/2000  |
| JP | 2002-169486 | 6/2002  |

OTHER PUBLICATIONS

Mar. 5, 2008 Official Action with English translation issued in Chinese Patent Application No. 200410081932X.

*Primary Examiner*—Kathleen Duda
*Assistant Examiner*—Caleen O Sullivan
(74) *Attorney, Agent, or Firm*—Buchanan Ingersoll & Rooney PC

(57) ABSTRACT

Disclosed herein is a method for forming a metal pattern with a low resistivity. The method comprises the steps of: (i) coating a photocatalytic compound onto a substrate to form a photocatalytic film layer; (ii) coating a water-soluble polymeric compound onto the photocatalytic film layer to form a water-soluble polymer layer; (iii) selectively exposing the two layers to light to form a latent pattern acting as a nucleus for crystal growth; and (iv) plating the latent pattern with a metal to grow metal crystals thereon. According to the method, a multilayer wiring pattern including a low resistivity metal can be formed in a relatively simple manner at low cost, and the metals constituting the respective layers can be freely selected according to the intended application. The low resistivity metal pattern can be advantageously applied to flat panel display devices, e.g., LCDs, PDPs and ELDs.

10 Claims, 1 Drawing Sheet

U.S. PATENT DOCUMENTS

2004/0265730 A1* 12/2004 Takahashi et al. ........ 430/270.1
2006/0019182 A1 1/2006 Lee et al.
2006/0097622 A1* 5/2006 Noh et al. .................. 313/495
2006/0105251 A1 5/2006 Hwang et al.

* cited by examiner

METHOD OF FORMING METAL PATTERN HAVING LOW RESISTIVITY

BACKGROUND OF THE INVENTION

This non-provisional application claims priority under 35 U.S.C. § 119(a) to Korean Patent Application No. 2003-92112 filed on Dec., 16, 2003, which is herein incorporated by reference.

FIELD OF THE INVENTION

The present invention relates to a method for forming a metal pattern with a low resistivity. More particularly, it relates to a method for forming a metal pattern by sequentially forming a photocatalytic film layer composed of a photocatalytic compound (i.e., a compound whose reactivity is changed by light) and a water soluble polymer layer on a substrate, selectively exposing the two layers to light to form latent image centers for crystal growth by photoreaction, and plating the latent pattern with a desired metal to grow metal crystals on the latent pattern.

DESCRIPTION OF RELATED ART

With increasing demand for large display areas and flat panel displays with high resolution (e.g., liquid crystal displays (LCDs), plasma display panels (PDPs), and inorganic and organic luminescent displays (ELDs)), metal wirings are considerably extended in length. Furthermore, the design rule for increased aperture ratio is decreased. This creates several problems, such as a drastic increase in wiring resistance and capacitance as well as signal delay and distortion. Under these circumstances, the development of a process for forming metal wiring with a low resistivity is essential to developing high resolution and large area flat panel display devices.

The use of low resistivity aluminum (Al) as a wiring material has been actively discussed in large-sized LCDs. In this case, AlNd, an aluminum alloy, is used to prevent the problem of wiring non-uniformity (e.g., hillock, due to substance migration exhibited when pure Al is used). Because of an increase in resistivity caused by the addition of an alloy, however, and an increase in contact resistance by high reactivity with α-Si or ITO, a multilayer structure (e.g., Cr/AlNd/Cr) is required when an aluminum alloy is used as source/drain electrode material. However, complicated processes are required to form a multilayer metal pattern, which results in a productivity limitation.

Metals usable to form metal wirings of flat panel display devices are presented in the Periodic Table shown in Table 1 below:

TABLE 1

Summary of metals usable for metal wiring in the Periodic Table in the Elements

| Ia | IIa | Atomic Number Atomic Symbol Resistivity (μΩcm) | | | | | Metals currently used in LCD manufacturing industry Contact metal candidates Low-resistivity metal candidates | | | | | | | IIIa | IVa |
|---|---|---|---|---|---|---|---|---|---|---|---|---|---|---|---|
| 3 Li 8.55 | 4 Be 4.0 | | | | | | | | | | | | | 5 B 1E12 | 6 G 1E19 |
| 11 Na 4.2 | 12 Mg 4.45 | IIIb | IVb | Vb | VIb | VIIb | | VII | | Ib | IIb | | | | 14 Si 1E05 |
| 19 K 6.15 | 20 Ca 3.43 | 21 Sc 61.0 | | 23 V 24.8 | | 25 Mn 185 | | | | | Zn | | | 31 Ga 27 | 32 Ge 1E07 |
| 37 Rb 12.5 | 38 Sr 23.0 | 39 Y 57.0 | 40 Zr 42.1 | | | 43 Tc 22.6 | | | | | Cd | | | In | Sn |
| 55 Ca 20.0 | 56 Ba 50 | 57 Lu 79.0 | 72 Hf 35.1 | | | 75 Re 19.3 | | | | | | | 80 Hg 94.1 | 81 Ti 18.0 | 82 Pb 20.65 |

Aluminum alloys are currently used, but copper (Cu) and silver (Ag) have been the focus of intense interest. This is due to their low resistivity and good contact properties on an amorphous silicon layer. However, when copper or silver is used as a gate electrode, it exhibits poor adhesion to a lower substrate and thus the metal wiring tends to strip off during subsequent processes. Further, when copper or silver is used as a source or drain electrode, the atoms diffuse into an amorphous silicon layer at 200° C. or electromigration takes place due to electric drive. This causes deterioration in wiring and device properties. Accordingly, in order to use copper or silver as a wiring material having a low resistivity, there is a need to form an additional metal layer. The layer needs to have good adhesion to a substrate and a low contact resistance in the lower portion and/or the upper portion of the wiring material. This leads to a multilayer metal pattern.

In order to satisfy the need to form a large display area at a relatively low cost, it is therefore necessary to develop techniques capable of replacing conventional wiring materials with new materials such that multilayer metal wiring can be formed in a relatively simple manner.

Currently, metal patterns are formed using a photoresist. This method, however, involves complex processes, including metal sputtering, photoresist patterning and developing, and etching. It is accordingly not suitable for forming a multilayer metal pattern. In addition, there are substantial technical difficulties and increased manufacturing costs associated with the development of vacuum thin film deposition equipment for forming large area patterns on glass substrates of increased size.

U.S. Pat. No. 5,534,312 reports a method for forming a metal pattern without the necessity of an etching process. The method involves the following steps: coordinately binding an organic compound, which is susceptible to light, to a metal thereby producing an organometallic compound; coating the organometallic compound onto a substrate; and, irrdiating the organometallic compound with light without application of a photosensitive resin. In this method, when the coated substrate is exposed to light through a patterned mask, the light directly reacts with the organometallic compound resulting in the decomposition of organic ligands coordinately bonded to the metal. The decomposition separates the ligands from the metal. The metal atoms react with adjacent metal atoms or ambient oxygen, and eventually a pattern of a metal oxide film is formed. The method is problematic, however, due to ligand contamination. Most of the ligands are separated by photoreaction in order to form the metal or metal oxide film. Furthermore, in connection with improving the electrical conductivity of the oxide film, the method disadvantageously involves reduction and surface annealing at 200° C. or higher for 30 minutes to several hours with a flow of a mixed gas of hydrogen and nitrogen.

Another method for forming a metal wiring by an ink-jet process is described in Japanese Patent Laid-open No. Hei 2002-169486. But, this method has problems of low resolution and difficult formation of highly electrically conductive wiring. Furthermore, U.S. Pat. No. 6,521,285 discusses the formation of metal wiring by micro-contact pringint and electroless plating. This approach, however, has a disadvantage in that uniform metal wiring usable in a large area flat panel display device is seldom formed.

There is therefore a need in the art for a simple method that enables the formation of a multilayer metal pattern including a highly electrically conductive metal.

SUMMARY OF THE INVENTION

The present inventors have found that a single-layer or multilayer metal pattern including a highly electrically conductive metal can be formed in a simple manner. This is accomplished by: sequentially forming a photocatalytic film layer composed of a compound whose reactivity is changed by light (i.e., a photocatalytic compound), and a water-soluble polymer layer on a substrate; selectively exposing the two layers to light to form latent image centers for crystal growth (via photoreaction); and, plating the latent pattern with a desired metal to grow metal crystals on the latent pattern. In addition, the present inventors have found that the metal pattern possesses excellent metal wiring properties.

A feature of the present invention, therefore, is to provide a method for forming a single layer or multilayer metal pattern in a rapid, efficient and simple manner. The method is performed without the need for a metal thin film forming process requiring high vacuum or high temperature conditions. Furthermore, the method does not involve a photoresist process for forming a fine pattern or a subsequent etching process.

A further feature of the present invention is to provide a flat panel display device that is manufactured using a metal pattern formed by the method.

In accordance with the features of the present invention, there is provided a method for forming a metal pattern comprising the steps of: (i) coating a photocatalytic compound onto a substrate to form a photocatalytic film layer; (ii) coating a water-soluble polymeric compound onto the photocatalytic film later to form a water-soluble polymer layer; (iii) selectively exposing the two layers to light to form latent image centers for crystal growth; and (iv) plating the latent pattern with a metal to grow metal crystals thereon.

According to the present invention, there is further provided a metal pattern formed by the method.

According to the present invention, there is further provided a flat panel display device comprising the metal pattern as a metal wiring.

According to the present invention, there is yet further provided a flat panel display device comprising the metal pattern as an electromagnetic interference filter.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
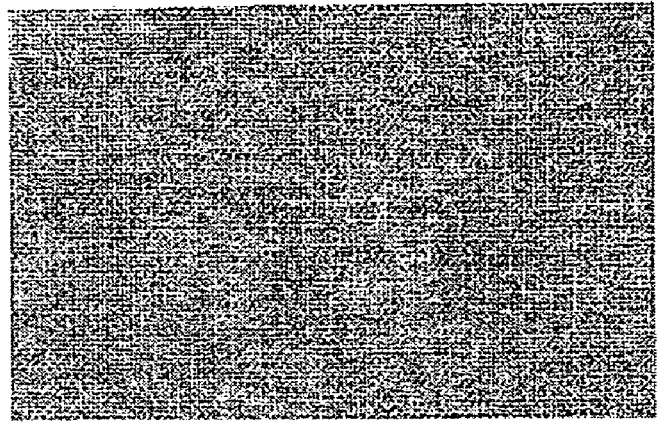
FIG. 1 is an optical microscope image of a metal pattern formed according to Example 1 of the present invention.

Hereinafter, the present invention will be explained in more detail, based on the respective steps.

Step (i):

In this step, a photocatalytic compound is coated onto a substrate to form a transparent amorphous photocatalytic film layer on the substrate.

The term "photocatalytic compound" as used herein refers to a compound whose characteristics are considerably changed by light, particularly, a compound which is inactive when not exposed to light, but is activated upon exposure to light, e.g., UV light. The electrons of the exposed portions of the photocatalytic compound are excited upon exposure to UV light, thus capable of exhibiting activity, for example, reducing ability. Accordingly, reduction of metal ions in the exposed portions takes place and thus a negative-type latent pattern can be formed on the exposed portion.

Preferred examples of photocatalytic compounds include any Ti-containing organometallic compound which can form transparent amorphous $TiO_2$ by annealing, e.g., tetraisopropyltitanate, tetra-n-butyltitinate, tetrakis(2-ethyl-hexyl)titanate, polybutyltitanate and the like.

After dissolving the photocatalytic compound in an appropriate solvent such as isopropyl alcohol, the coating of the solution onto the substrate can be conducted by spin coating, spray coating, screen printing or the like.

Examples of substrates usable in the present invention include, but are not especially limited thereto, transparent plastic and glass materials. As examples of the transparent plastic substrate, acrylic resins, polyesters, polycarbonates, polyethylenes, polyethersulfones, olefin maleimide copolymers, norbornene-based resins, etc. can be mentioned. In the case where excellent heat resistance is required, olefin maleimide copolymers and norbornene-based resins are preferred. Otherwise, it is preferred to use polyester films, acrylic resins and the like.

A 30-1,000 nm thick coating layer is formed by the coating of the photocatalytic compound. After coating, the coating layer is heated on a hot plate or in a convection oven at a temperature not higher than 200° C. for 20 minutes to form the desired photocatalytic film layer. Heating at a temperature exceeding 200° C. leads to formation of a crystalline $TiO_2$ layer, thus resulting in poor optical properties and patterning profile.

Step (ii):

In this step, a water-soluble polymeric compound is coated onto the photocatalytic film layer to form a water-soluble polymer layer thereon. Examples of water-soluble polymeric compounds used herein include homopolymers, such as polyvinylalcohols, polyvinylphenols, polyvinylpyrrolidones, polyacrylic acids, polyacrylamides, gelatins, etc., and copolymers thereof.

First, 2-30% by weight of the water-soluble polymeric compound is dissolved in water. Thereafter, the resulting solution is coated onto the photocatalytic film layer, followed by heating, to form a water-soluble polymer layer.

The water-soluble polymer layer thus formed plays a roll in promoting photoreduction upon exposure to UV light, and in acting to improve the photocatalytic activity.

Preferably, a photosensitizer may be added to the water-soluble polymer layer in order to further increase its photosensitivity. As the photosensitizer, a water-soluble compound selected from colorants, organic acids, organic acid salts and organic amines can be used. Specific examples of photosensitizers include tar colorants, potassium and sodium salts of chlorophylline, riboflavine and derivatives thereof, water-soluble annatto, $CuSO_4$, caramels, curcumine, cochinal, citric acid, ammonium citrate, sodium citrate, oxalic acid, K-tartrate, Na-tartate, ascorbic acid, formic acid, triethanolamine, monoethanolamnine, malic acid and the like.

The amount of the photosensitizer added is in the range of 0.01-5 parts by weight, based on 100 parts by weight of the water-soluble polymeric compound.

Thereafter, the water-soluble polymer layer is heated at a temperature not higher than 100° C. for 5 minutes or less to evaporate water. The thickness of the final water-soluble polymer layer is controlled to the range of 0.1~1 μm.

Step (iii):

In this step, the photocatalytic film layer and the water-soluble polymer layer are selectively exposed to light to form latent image centers for crystal growth thereon. Exposure atmospherics and exposure dose are not especially limited, and can be properly selected according to the kind of photocatalytic compound used. The activated photocatalytic pattern acts as a nucleus for metal crystal growth in a subsequent plating step.

The latent pattern is treated with a metal salt solution to form a catalyst pattern thereon, in order to effectively form a metal pattern in subsequent step (iv). As the metal salt solution, a silver (Ag) salt solution, a palladium (Pd) salt solution or a mixed solution thereof is preferably used.

Step (iv):

In this step, the latent image centers for crystal growth formed in step (iii), or if desired, the catalyst pattern, is subjected to metal-plating to grow metal crystals on the patterned nuclei for crystal growth, thereby forming a metal pattern. The metal-plating is performed by an electroless or electroplating process. Since the catalyst pattern formed by treating the latent pattern with the metal salt solution has a sufficient activity upon electroless-plating, crystal growth is accelerated and thus a more densely packed metal pattern can be advantageously formed.

It is to be understood that, upon forming the metal pattern, at least two layers of metal crystals can be grown on latent image centers for crystal growth by continuous plating to form a multilayer metal pattern. For example, latent image centers for crystal growth are plated with a desired metal to form a first metal layer, and then the first metal layer is plated with another desired metal to form a second metal layer only on the portions where the first metal layer is formed, thereby facilitating the formation of a multilayer metal pattern.

The kind of plating metals used and the plating order may be suitably chosen depending on the intended application. The metals constituting each metal layer may be identical to or different from each other. The thickness of the metal layers can be properly controlled.

In order to form a metal pattern having a low resistivity, it is necessary to consider the adhesion to a substrate and the contact properties between a substrate and an insulating film. In the present invention, a metal such as Ni, Pd, Sn or Cr, or an alloy thereof is preferably used to form the first metal layer, and a highly electrically conductive metal such as Cu, Ag or Au, or an alloy thereof is preferably used to form the second metal layer. At this time, the metal layers are preferably formed to have a thickness of 0.1-1 μm and 0.3-20 μm, respectively. Nickel is preferably used to form the first metal layer and Ag or Cu is preferably used to form the second metal layer in terms of low price and ease of formation.

When the highly electrically conductive second metal layer is brought into contact with ITO (indium tin oxide) or a semiconductor component, it can be plated with Ni, Pd, Sn, Cr or an alloy thereof to form a third metal layer in order to improve the contact resistance between the second metal layer and the ITO or the semiconductor component. In the case where Cu is used to form the highly electrically conductive second metal layer, a noble metal such as Ag or Au may be used to form a third metal layer in order to prevent deterioration in physical properties of the second metal layer due to the formation of an oxide film on the surface.

Alternatively, a third metal layer may be formed by plating the second metal layer with the metal used to form the first metal layer in order to improve the contact resistance.

Various plating processes can be appropriately combined to form the multilayer metal layers. For example, when the first metal layer is formed on an insulating film, an electroless-plating process is employed. On the other hand, when Cu or Ag is used to form the second metal layer, an electroless or electro-plating process is employed.

The electroless or electro-plating is achieved by a well-known procedure, and commercially available plating compositions can be used for plating. In an electroless-plating process, the substrate on which Pd or Ag nucleus catalyst for crystal growth is formed is dipped in a plating solution containing 1) a metal salt, 2) a reducing agent, 3) a complexing agent, 4) a pH-adjusting agent, 5) a pH buffer and 6) a modifying agent. The metal salt of 1) serves as a source providing metal ions. Examples of the metal salt include chlorides, nitrates, sulfates and acetates of the corresponding metal. The reducing agent of 2) acts to reduce metal ions present on the substrate. Specific examples of the reducing agent include $NaBH_4$, $KBH_4$, $NaH_2PO_2$, hydrazine, formaline and polysaccharides (e.g., glucose). $NaH_2PO_2$ is preferably used for a nickel plating solution, and formaline and polysaccharides are preferably used for a Cu or Ag plating solution. The complexing agent of 3) functions to prevent the precipitation of hydroxides in an alkaline solution and to control the concentration of free metal ions, thereby preventing the decomposition of metal salts and adjusting the plating speed. Specific examples of the complexing agent include ammonia solution, acetic acid, guanine acid, tartaric acid, chelating agents (e.g., EDTA) and organic amine compounds. Chelating agents (e.g., EDTA) are preferred. The pH-adjusting agent of 4) plays a roll in adjusting the pH of the plating solution, and is selected from acidic or basic compounds. The pH buffer of 5) inhibits the sudden change in the pH of the plating solution, and is selected from organic acids and weakly acidic inorganic compounds. The modifying agent of 6) is a compound capable of improving coating and planarization characteristics. Specific examples of the modifying agent include common surfactants and adsorptive substances capable of adsorbing components interfering with the crystal growth.

In an electroplating process, a plating solution having a composition consisting of 1) a metal salt, 2) a complexing agent, 3) a pH-adjusting agent, 4) a pH buffer and 5) a modifying agent, is used. The functions and the specific examples of the components contained in the plating solution composition are as defined above in the electroless-plating process.

The low resistivity metal pattern thus formed can be useful as a metal wiring or an electromagnetic interference filter of flat panel display devices such as LCDs, PDPs and ELDs.

The present invention will now be described in more detail with reference to the following preferred examples. However, these examples are given for the purpose of illustration and are not to be construed as limiting the scope of the invention.

Formation of Latent Image Centers for Crystal Growth

After a solution of polybutyltitanate (2.5 wt %) in isopropanol was coated onto a transparent polyester film as a substrate by spin coating, the resulting coating layer was dried at 150° C. for 5 minutes so as to have a thickness of about 100 nm. Separately, 1 part by weight of triethanolamine as a photosensitizer was added to an aqueous solution of a polyvinylalcohol polymer (5 wt %) having a molecular weight of 25,000 (Polyscience), based on 100 parts by weight of the polymer, followed by stirring. The resulting mixture was coated onto the polybutyltitanate coating layer and dried at 60° C. for 2 minutes to prepare a photocatalytic film layer. UV light having a broad wavelength range was irradiated to the photocatalytic film layer through a photomask on which a minute pattern was formed using a UV exposure system (Oriel, U.S.A). After exposure, the substrate was dipped in a solution of 0.6 g of $PdCl_2$ and 1 ml of HCl in 1 l of water to deposit Pd particles on the surface of the exposed portion. As a result, a Pd-deposited negative pattern acting as nucleus for crystal growth was formed.

EXAMPLE 1

Formation of Negative-type Copper Wiring by Electroless Nickel Plating and Electroless Copper Plating The substrate prepared above was dipped in an electroless nickel plating solution to grow crystals of a patterned nickel wiring. The nickel wiring pattern was dipped in an electroless copper plating solution to form a negative-type two-layer nickel-copper wiring pattern. At this time, the electroless nickel plating solution and the copper plating solution were prepared so as to have the compositions (a) and (b) indicated in Table 2 below, respectively. The basic physical properties of the metal pattern are shown in Table 3 below. The thickness of the pattern was measured using α-step (manufactured by Dektak), and the resistivity was measured using a 4-point probe. The resolution was determined using an optical microscope, and the adhesive force was confirmed by a scotch tape peeling test. An optical microscope image of the metal pattern is shown in FIG. 1.

EXAMPLE 2

Figure 2:
FIG. 2 is an electron microscope image of a metal pattern formed according to Example 2 of the present invention.

Formation of Negative-type Copper Wiring by Electroless Nickel Plating and Electro Copper Plating The substrate prepared by irradiation through a photomask on which a mesh pattern was formed was dipped in an electroless nickel plating solution to selectively grow crystals of a nickel wiring. The nickel wiring pattern was dipped in an electroless copper plating solution and then an electric current (0.15 A) was applied to the plating solution to form a negative-type two-layer nickel-copper wiring pattern. The electroless nickel plating solution and the electro copper plating solution were prepared so as to have the compositions (a) and (c) indicated in Table 2 below, respectively. The basic physical properties of the metal pattern are shown in Table 3 below. An electron microscope image of the metal pattern is shown in FIG. 2.

EXAMPLE 3

Figure 3:
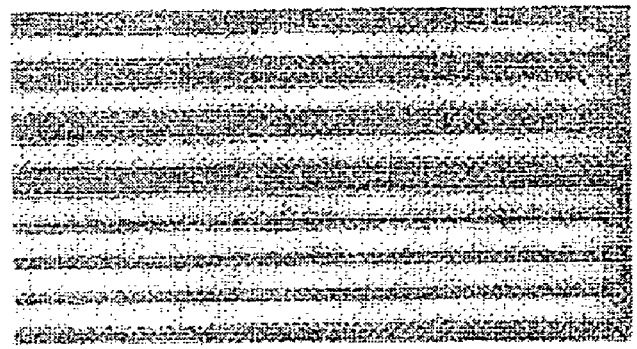
FIG. 3 is an optical microscope image of a metal pattern formed according to Example 3 of the present invention.

Formation of Negative-type Silver Wiring by Electroless Nickel Plating and Electroless Silver Plating The substrate prepared above was dipped in an electroless nickel plating solution to grow crystals of a nickel wiring. At this time, the electroless nickel plating solutions were prepared so as to have the composition (a) indicated in Table 2 below. The nickel wiring pattern was dipped in an electroless silver plating solution (S-700, Kojundo) chemical, Co., Ltd., Japan) to form a negative-type two-layer nickel-silver wiring pattern. The basic physical properties of the metal pattern are shown in Table 3 below. An optical microscope image of the metal pattern is shown in FIG. 3.

TABLE 2

| (a) Electroless nickel plating solution | (b) Electroless copper plating solution | (c) Electro copper plating solution |
|---|---|---|
| $NiCl_2 \cdot 6H_2O$ 10 g | $CuSO_4 \cdot 5H_2O$ 12 g | $CuSO_4 \cdot 5H_2O$ 72 g |
| $NaH_2PO_2 \cdot 2H_2O$ 30 g | $KNaC_4H_4O_6 \cdot 6H_2O$ 55 g | $H_2SO_4$ 230 g |
| $NaCH_3COO$ 10 g | NaOH 18 g | HCl 0.125 g |
| $NH_4Cl$ 40 g | $Na_2CO_3$ 10 g | OKUNO Lucina 10 g |
| Water 1 l | $Na_2S_2O_3 \cdot 5H_2O$ 0.0002 g | Water 1 l |
| 5~10 min. 50 μm | $CH_2O$ (40%) 20 ml | |
| Ni thickness > 0.1 μm | Water 1 l | |
| | 5~10 min. 50 μm | |
| | Cu thickness > 0.1 μm | |

TABLE 3

| Example No. | Metal thickness (μm) | Resistivity (μohm-cm) | Resolution (μm) | Adhesive force |
|---|---|---|---|---|
| Example 1 | 0.4 | 2.7 | <8 | Good |
| Example 2 | 1.5 | 2.0 | <10 | Good |
| Example 3 | 0.3 | 2.5 | <8 | Good |

According to the method of the present invention, single layer and multilayer metal patterns can be formed by forming a photocatalytic thin film by means of a simple coating process (instead of a conventional physical deposition) followed by light exposure and simple plating treatment. Accordingly, the present invention can provide a method for effectively forming single layer and multilayer metal patterns having a low resistivity in a rapid, efficient and simple manner without the necessity of a sputtering process requiring high vacuum conditions, a photopatterning process using a photosensitive resin and an etching process. The low resistivity metal pattern formed by the method of the present invention can be advantageously applied to flat panel display devices.

Although the preferred embodiments of the present invention have been disclosed for illustrative purposes, those skilled in the art will appreciate that various modifications, additions and substitutions are possible, without departing from the scope and spirit of the invention as disclosed in the accompanying claim.

What is claimed is:

1. A method for forming a metal pattern, comprising the steps of:
   (i) coating a photocatalytic compound onto a substrate to form a photocatalytic film layer wherein the photocatalytic compound is a Ti-containing organometallic compound which is capable of being converted to transparent amorphous $TiO_2$ by annealing;
   (ii) heating the coated substrate at a temperature not higher than 200° C. under conditions wherein the Ti-containing organometallic compound present on the substrate is converted to a transparent photocatalytic film layer of amorphous $TiO_2$;
   (iii) coating a water soluble polymeric compound onto the photocatalytic film layer of transparent amorphous $TiO_2$ to form a water-soluble polymer layer thereon;
   (iv) selectively exposing the two layers to light to form latent image centers for crystal growth; and
   (v) plating the resulting latent pattern with a metal to grow metal crystals thereon.

2. The method according to claim 1, wherein the electrons of the photocatalytic compound are excited upon exposure to light such that the photocatalytic compound has activity.

3. The method according to claim 1, wherein the Ti-containing organometallic compound is tetraisopropyltitanate, tetra-n-butyltitinate, tetrakis(2-ethyl-hexyl)titanate or polybutyltitanate.

4. The method according to claim 1, wherein the water-soluble polymeric compound is at least one polymer selected from the group consisting of polyvinylalcohols, polyvinylphenols, polyvinylpyrrolidones, polyacrylic acids, polyacrylamides, gelatins and copolymers thereof.

5. The method according to claim 1, wherein the water-soluble polymer layer further includes a photosensitizer.

6. The method according to claim 5, wherein the photosensitizer is selected from the group consisting of colorants, organic acids, organic acid salts and organic amines.

7. The method according to claim 6, wherein the photosensitizer is selected from the group consisting of tar colorants, potassium and sodium salts of chlorophylline, riboflavine and derivatives thereof, water-soluble annatto, $CuSO_4$, caramels, curcumine, cochinal, citric acid, ammonium citrate, sodium citrate, oxalic acid, K-tartrate, Na-tartrate, ascorbic acid, formic acid, triethanolamine, monoethanolamine and malic acid.

8. The method according to claim 1, further comprising the step of treating latent image centers for crystal growth formed in step (iv) with a metal salt solution to form a catalyst pattern on the latent pattern.

9. The method according to claim 8, wherein the metal salt solution is a palladium (Pd) salt solution, a silver (Ag) salt solution or a mixed solution thereof.

10. The method according to claim 8, wherein in step (v) the catalyst pattern is electroless-plated with Ni, Pd, Sn, Cr or an alloy thereof to form a first metal pattern, and then the first metal pattern is electro- or electroless-plated with Cu, Ag, Au or an alloy thereof to form a second metal pattern.

* * * * *